United States Patent
Mann

(10) Patent No.: US 9,471,042 B2
(45) Date of Patent: Oct. 18, 2016

(54) DELAY APPARATUS, NUCLEAR MEDICINE IMAGING DEVICE, DELAY METHOD, AND CALIBRATION METHOD

(71) Applicant: Toshiba Medical Systems Corporation, Otawara-shi (JP)

(72) Inventor: Gregory J Mann, Oak Park, IL (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 14/840,848

(22) Filed: Aug. 31, 2015

(65) Prior Publication Data

US 2015/0370223 A1    Dec. 24, 2015

Related U.S. Application Data

(63) Continuation of application No. PCT/US2014/020263, filed on Mar. 4, 2014, which is a continuation of application No. 13/784,319, filed on Mar. 4, 2013.

(51) Int. Cl.

| | | |
|---|---|---|
| *G01J 1/00* | (2006.01) | |
| *G04F 10/00* | (2006.01) | |
| *H03H 11/26* | (2006.01) | |
| *H03M 1/06* | (2006.01) | |
| *G01T 1/29* | (2006.01) | |
| *H03M 1/10* | (2006.01) | |

(52) U.S. Cl.
CPC ........... *G04F 10/005* (2013.01); *G01T 1/2985* (2013.01); *H03H 11/265* (2013.01); *H03M 1/0617* (2013.01); *H03M 1/1009* (2013.01)

(58) Field of Classification Search
CPC . G04F 10/005; H03M 1/0617; H03H 11/265
See application file for complete search history.

(56) References Cited

U.S. PATENT DOCUMENTS

| | | | |
|---|---|---|---|
| 5,384,713 A | * | 1/1995 | Kleinfelder ........... G04F 10/005 324/113 |
| 2008/0069292 A1 | | 3/2008 | Straayer et al. |
| 2008/0238652 A1 | | 10/2008 | Henzler et al. |
| 2010/0295590 A1 | | 11/2010 | Yoshihara et al. |
| 2012/0104259 A1 | | 5/2012 | Mann |

FOREIGN PATENT DOCUMENTS

WO    WO 2012/137109 A2    10/2012

OTHER PUBLICATIONS

Yousif et al., "A fine resolution TDC architecture for next generation PET imaging," 2007, IEEE Transactions on Nuclear Science, vol. 54, No. 5, pp. 1574-1582.*

(Continued)

Primary Examiner — Kiho Kim
(74) Attorney, Agent, or Firm — Oblon, McClelland, Maier & Neustadt, L.L.P

(57) ABSTRACT

A delay apparatus of an embodiment is an apparatus for delaying a signal to a plurality of chain-based time-to-digital circuits (TDCs) and includes a plurality of propagation path devices each connected to a respective one of the plurality of TDCs. Each propagation path device is configured to delay a common start signal sent to each propagation path device by a selectable amount based on a delay selection signal received by the propagation path device, and to transmit the delayed start signal to the respective one of the TDCs.

6 Claims, 8 Drawing Sheets

(56) References Cited

OTHER PUBLICATIONS

Jansson et al., "A CMOS Time-to-Digital converter with better than 10 ps single-shot precision," 2006, IEEE Journal of Solid-State Circuits, vol. 41, No. 6, pp. 1286-1296.*

International Search Report issued Sep. 24, 2014 in PCT/US2014/020263 filed Mar. 4, 2014.

Written Opinion issued Sep. 24, 2014 in PCT/US2014/020263 filed Mar. 4, 2014.

* cited by examiner

DELAY APPARATUS, NUCLEAR MEDICINE IMAGING DEVICE, DELAY METHOD, AND CALIBRATION METHOD

CROSS-REFERENCE TO RELATED APPLICATIONS

This application is a continuation of PCT international application Ser. No. PCT/US2014/020263 filed on Mar. 4, 2014 which designates the United States, incorporated herein by reference, and which claims the benefit of priority from U.S. patent application Ser. No. 13/784,319, filed on Mar. 4, 2013, the entire contents of which are incorporated herein by reference.

FIELD

The embodiments described herein relate generally to a delay apparatus, a nuclear medicine imaging device, a delay method, and a calibration method.

BACKGROUND

A time-to-digital-converter (TDC) is often used to measure timing in a gamma ray detector. A TDC accurately converts the realization of an event into a number than can be related to the time the event occurred. Various methods exist to perform this task. Among others, counting a large number of very fast logic transitions between coarse clock cycles has been used to perform this task. In some cases, it may be desirable to indicate the occurrence of a series of events known to be generated sequentially. For instance, the time a rising signal takes to reach a pre-determined set of threshold values can be very useful information.

Time-to-digital converters have also been implemented with a variety of architectures, such as a classic delay chain having a single chain of identical delay elements connected in series or a Vernier delay chain.

An essential component of time-of-flight positron emission tomography (PET) systems is the time-to-digital converters that are used to measure the arrival time of detected photons at the detector. The measured time can be used to create a bound on the line-of-response, which can be used to estimate the position at which the positron emission event took place. As the accuracy of the TDC increases the bound becomes tighter, providing more accurate position information.

Multiple delay-chain-based TDCs are used together to determine time from a single event signal. Specifically, a single input is connected to the input of two or more delay chains. The resulting output time values are then averaged to produce a single, more accurate time value. The accuracy of the delay-chain-based TDC is dependent upon the size in time of the sampled steps of the delay chain. The sampled steps can vary by a significant amount depending upon the physical limitations of the TDC. In some cases variations of up to ten times have been observed. By utilizing multiple delay chains, the inputs are offset in time such that one chain is measuring a large bin while other chains are measuring a small bin. In other words, the accuracy of some of the chains is less than the others due to a measurement range being traded-off for bin size.

It is difficult to incorporate offsets into a TDC implementation and to improve timing accuracy over single delay-chain-based TDCs, as there exists significant manufacturing-based variation in the speed of on-chip circuits. These variations will affect the optimal offset that permits extraction of the maximal accuracy from the collective TDC circuit. Thus, there is a need to compensate for the manufacturing variation so as to increase the timing accuracy of the implemented TDC on every chip.

An object of the present invention is to provide a delay apparatus, a nuclear medicine imaging device, a delay method, and a calibration method that can increase the timing accuracy of a TDC.

DETAILED DESCRIPTION

Figure 1:
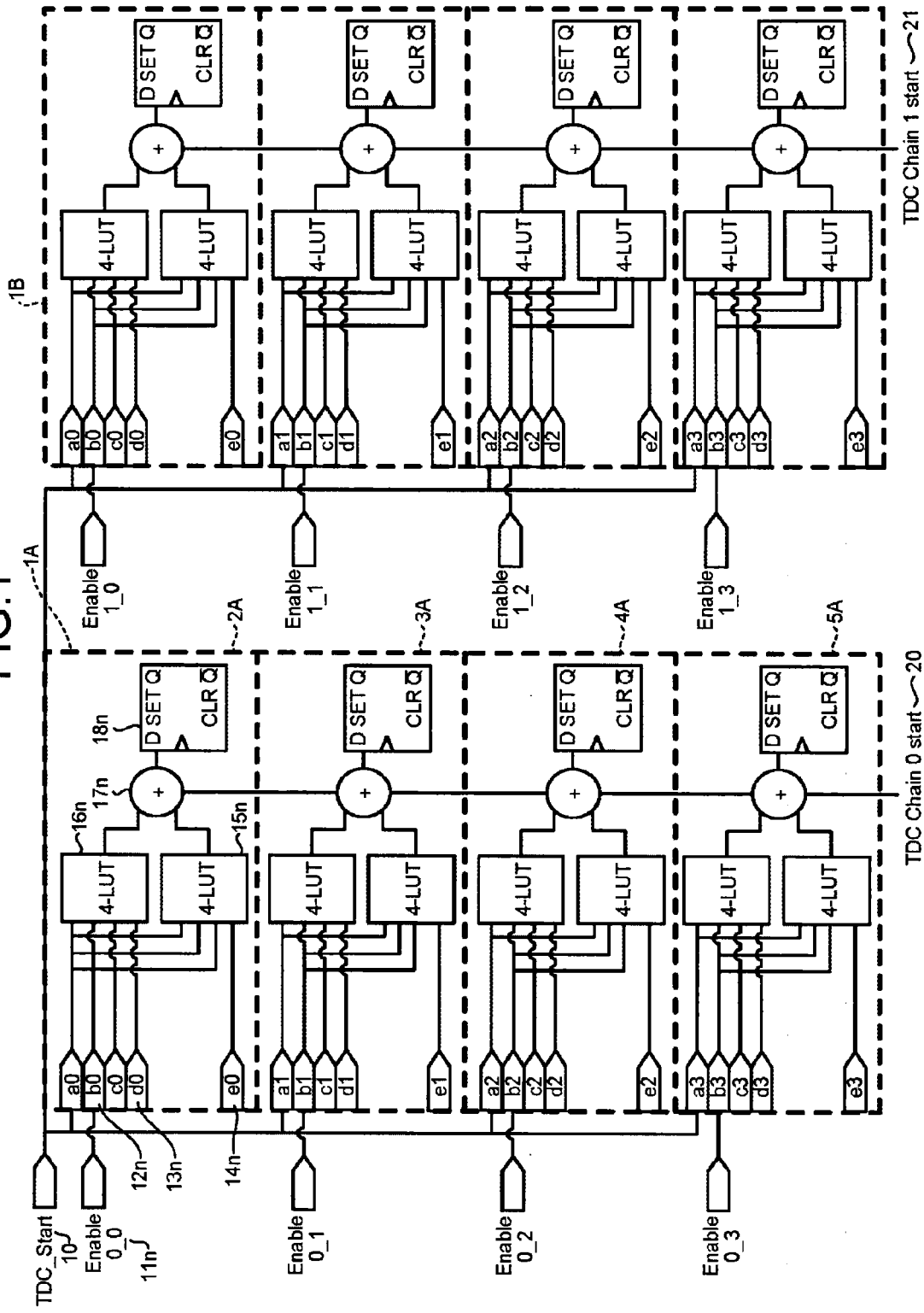
FIG. 1 is a schematic drawing of an apparatus for delaying a signal to a plurality of chain-based time-to-digital circuits (TDCs) according to one embodiment.

The embodiments described herein and their accompanying advantages will be more perfectly understood with reference to the detailed descriptions in association with the accompanying drawings. The embodiments described herein relate generally to an apparatus for programmable insertion delay to delay chain-based time to digital circuits and to an associated methodology for improved measurement accuracy and resolution. The present application is related to U.S. Pat. No. 8,222,607, the contents of which are incorporated herein by reference.

In one embodiment, there is described an apparatus for delaying a signal to a plurality of chain-based time-to-digital circuits (TDCs). The apparatus includes a plurality of propagation path devices each connected to a respective one of the plurality of TDCs, each propagation path device configured to delay a common start signal sent to each propagation path device by a selectable amount based on a delay selection signal received by the propagation path device, and to transmit the delayed start signal to the respective one of the TDCs.

According to another embodiment of the apparatus, each propagation path device includes a plurality of delay modules each providing a different amount delay to the start signal.

According to another embodiment of the apparatus, the plurality of delay modules of each propagation path device are disposed in series between an input receiving the start signal and an output connected to the respective one of the TDCs.

According to another embodiment of the apparatus, each of the plurality of delay modules is activated to receive the start signal based on the delay selection signal.

According to another embodiment of the apparatus, the plurality of delay modules of each propagation path device are disposed in series between an input receiving the start signal and an output connected to the respective TDC and when one of the delay modules is activated by the delay selection signal, the signal bypasses each delay module upstream from the activated delay module and passes though each delay module downstream from the activated delay module.

According to another embodiment of the apparatus, each of the plurality of delay modules includes at least one hardware based look up table (LUT).

According to another embodiment of the apparatus, each of the plurality of delay modules includes at least one flip-flop.

According to another embodiment of the apparatus, the delay selection signal is determined by user input. According to another embodiment of the apparatus, the delay selection signal is determined by an algorithm which determines the optimal propagation delay for each TDC. In one embodiment, there is described a method for delaying a signal to a plurality of chain-based time to digital circuits (TDCs). The method includes the steps of receiving a delay selection signal indicating a determination of an amount of time to delay a start signal, activating, at each one of a plurality of propagation path devices, one of a plurality of delay modules based on the delay selection signal, each of the plurality of delay modules providing delay to the start signal which is received by a respective TDC via at least one of the plurality of delay modules, receiving the start signal at the activated one of the plurality of delay modules, delaying the start signal by way of propagation through the delay module, and transmitting the delayed start signal to the respective TDC.

According to another embodiment of the method, the activating further includes the step of activating one of a plurality of delay modules to receive the start signal based on the delay selection signal.

According to another embodiment of the method, the delaying further includes the step of delaying the start signal by passing the start signal through a logic array block look-up table (LUT).

According to another embodiment of the method, the receiving further includes the step of receiving the start signal by bypassing each delay module upstream from the activated delay module.

According to another embodiment of the method, the transmitting further includes the step of transmitting the start signal to the TDC though each delay module downstream from the activated delay module.

In one embodiment, there is described a method of calibrating a system including a plurality of chain-based time-to-digital circuits (TDCs). The method includes the steps of receiving a delay selection signal indicating an amount of time to delay a start signal, activating, at each one of a plurality of propagation path devices, one of a plurality of delay modules based on the delay selection signal, each of the plurality of delay modules providing delay to the start signal that is received by a respective TDC via at least one of the plurality of delay modules, receiving the start signal at the activated one of the plurality of delay modules, delaying the start signal by way of propagation through the delay module, transmitting the delayed start signal to the respective TDC, measuring performance of the respective TDC using the delay selection signal to obtain an evaluation value for the delay selection signal, repeating the receiving, activating, receiving, delaying, transmitting, and measuring step for each possible delay selection signal to obtain a corresponding evaluation value for each possible delay selection signal, and determining which of the possible delay selection signals results in a highest evaluation value.

In general, time-to-digital converter devices according to exemplary embodiments of the present advancements each include at least one delay chain circuit that generates a first value corresponding to a time delay between a start signal and a stop signal.

The present advancements provide a calibration path for TDCs implemented as two or more independent delay chains whose outputs are averaged together on programmable logic devices e.g., Field Programmable Gate Arrays (FPGAs). Due to inherent differences in propagation delays on a silicon device caused by manufacturing variances, as well as non-uniformity in tap delays on the different delay chains (e.g., intra-logic array block delays versus inter-logic array block delays on FPGAs), a fixed arrival time of the chain initialization signal across all independent chains will not necessarily yield the optimal performance across different physical dies.

The present advancements provide a way by which insertion skew can be programmably added to each individual chain. By adjusting this insertion skew, an optimal combination of skews (e.g., delays) can be found that will extract the optimal accuracy performance of the TDC as a whole.

Referring now to the drawings, wherein like reference numerals designate identical or corresponding parts throughout the several views, FIG. 1. is a schematic drawing of an apparatus for delaying a signal to a plurality of chain-based time-to-digital circuits (TDCs) according to one embodiment. Specifically, FIG. 1 is a schematic drawing of a FPGA-based implementation of a device for providing calibration paths for time to digital circuits.

As is illustrated in FIG. 1, two TDC chains are arranged such that the respective TDC chain input 20/21 is connected to the device 1A/1B for providing calibration paths. Applicants note that although two chains and two devices 1A/1B are illustrated, more than two chains and devices 1A/1B may be included in the system.

The TDC start 10 input receives the TDC start signal for an event that is being measured. Based on a predetermined setting, insertion skew (e.g., delay) is added to the signal such that the TDC signal arrives at the respective TDC chain start position 20/21 with a predetermined amount of delay. This delay is configurable so that a more accurate time measurement can be obtained.

The devices 1A/1B of FIG. 1 may be implemented with discrete logic gates, as an Application Specific Integrated Circuit (ASIC), a Field Programmable Gate Array (FPGA), or other Complex Programmable Logic Device (CPLD). In FPGA or CPLD implementations, the device may be coded in VHDL, Verilog or any other hardware description language as a set of computer-readable instructions, and the computer-readable instructions may be stored in electronic memory directly in the FPGA or CPLD, or as separate electronic memory. Further, the electronic memory may be non-volatile, such as a ROM, EPROM, EEPROM, or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

The multiple logic array block (LAB) look up tables (LUTs) 15n/16n shown in FIG. 1 may be implemented using FPGAs and are configured to pass the "TDC_Start" signal received from input 10 through to a respective carryout output 17n of one of the fast-carry chain elements 2A-5A, when the respective "enable0_n" signal is activated. When the "enable0_n" signals are activated in a mutually exclusive fashion, each possible combination yields a different propagation delay from the TDC_Start input to the TDC Chain 0 start output. Likewise, activating the "enable1_n" signals, in a similar fashion, yields different propagation delays from the TDC_Start input to the TDC Chain 1 start output. By utilizing all possible combinations of "enable0_n" and "enable1_n" activations, a combination can be determined that provides the optimal timing accuracy performance of the TDC as a whole. The accuracy of the TDC circuit is measured by injecting pairs of start-stop signals of known timing (for example from a function generator). For each configuration of enable0_n and enable1_n pairs as described above, a histogram of the times between the start and stop, as measured by the TDC in a given configuration, is generated. A distribution of timing values is derived from the histogram. The distribution is analyzed and the quality of the configuration is based on some metric calculated in the distribution. Examples of the metric include but are not limited to the standard deviation or the Full Width Half Max (FWHM). These metrics measure the "width" of the distribution, where a smaller "width" is preferable.

Each of the fast-carry chain modules 2A-5A in each device 1A/1B, includes an input 11n that receives the enable0/1_n signal. The enable0/1_n signal indicates which of the fast-carry chain elements 2A-5A is active. For example, when enable signal enable0_2 is set to "1" the second fast carry chain element 3A is activated. The enable0_n and enable1_n signals may be determined based on user input and thus may be programmably configurable and updatable by a user or by an administrator of the TDC system.

The path used for propagation is known a priori due to dynamically changing the configuration. An external source (such as a predetermined software application) sets the configuration. Since the source is setting the configuration, the source knows the current configuration.

Each of the fast-carry chain modules 2A-5A also includes an element 17n, which is a standard full-adder circuit embedded in the LAB blocks and a logic element such as a D-type flip-flop 18n. The basic input to output functionality if element 17n is used to implement the path selection and delay chain functionality. The flip flops implement the stop function of the TDC. The stop signal is the clock signal to the flip-flops.

Thus, the present embodiment illustrates a FPGA-based implementation that makes use of "Fast Carry Chain" architectures. The fast carry chain modules 2A-5A are utilized as delay taps for the delay chains used in the TDCs. By routing the initialization signal to multiple logic array block (LAB) look-up tables (LUTs) 15n/16n, separate enable signals 11n routed to the LUTs can activate different paths for different propagation delays to the start of the TDC chains 20/21.

Figure 2:
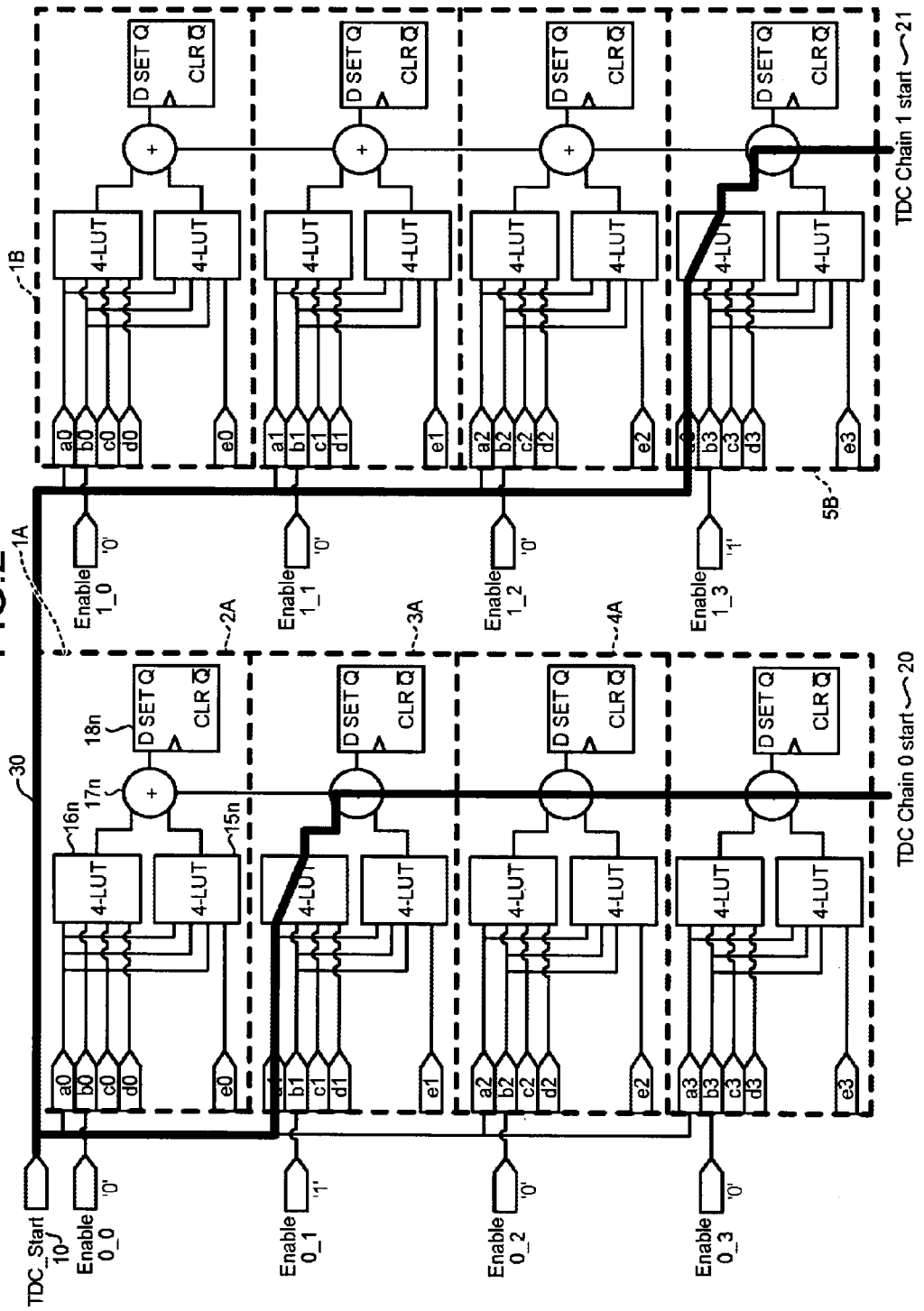
FIG. 2 is a schematic drawing illustrating the operation of the apparatus for delaying a signal to a plurality of chain-based TDCs according to one embodiment.

FIG. 2 illustrates an example in which two different propagation paths are selected for the TDC chains 20/21.

Specifically, the TDC_Start signal received at input 10 is split and forwarded to both devices 1A and 1B. Based on the activation signals received at the Enable0_n and Enable1_n inputs, the TDC_Start signal is accepted by fast-carry chain modules 3A and 5B and respectively routed to TDC Chain0 start 20 and TDC Chain1 start 21. Each of these two paths has a respective propagation delay that may be the same or different from one another, but is designed to improve the timing accuracy performance of the TDC by balancing out the timings of the various chains.

For instance, in the example shown in FIG. 2, the delay for path 31 may be 5 to 10 ns less than the delay for path 30. This difference in the propagation delay compensates for manufacturing-based variation in the speed of on-chip circuits. These variations can affect the optimal offset that should be used to extract the maximal accuracy from the collective TDC circuit. As a result, the different paths provide compensation to the manufacturing variation, thereby increasing the timing accuracy of the implemented TDC on every chip.

The delay provided by the paths 30 and 31 is based on the number fast-carry chain modules through which the TDC_Start signal passes. For example, because path 31 enters the device 1A at fast-carry chain module 3A, the path includes all additional modules downstream of module 3A (i.e., modules 4A and 5A). This results in a greater delay than path 30 which only include one fast-carry chain module 58 in the path. The fast-carry chain modules can each provide the same amount of delay or at least one of the modules can include a different amount of delay from the other modules.

In an alternative embodiment, each fast-carry chain module can include a predetermined amount of delay. For instance, module 2A could include 5 ns of delay, module 3A could include 10 ns of delay, module 4A could include 15 ns of delay and module 5A could include 20 ns of delay. In this embodiment, the number of modules through which the signal passes does not effect the final delay. Only the first module which receives the signal controls the amount of delay provided. In this embodiment, the signal for each of 2A, 3A, 4A, and 5A are respectively multiplexed before entering "TDC Chain 0" 20.

Figure 3:
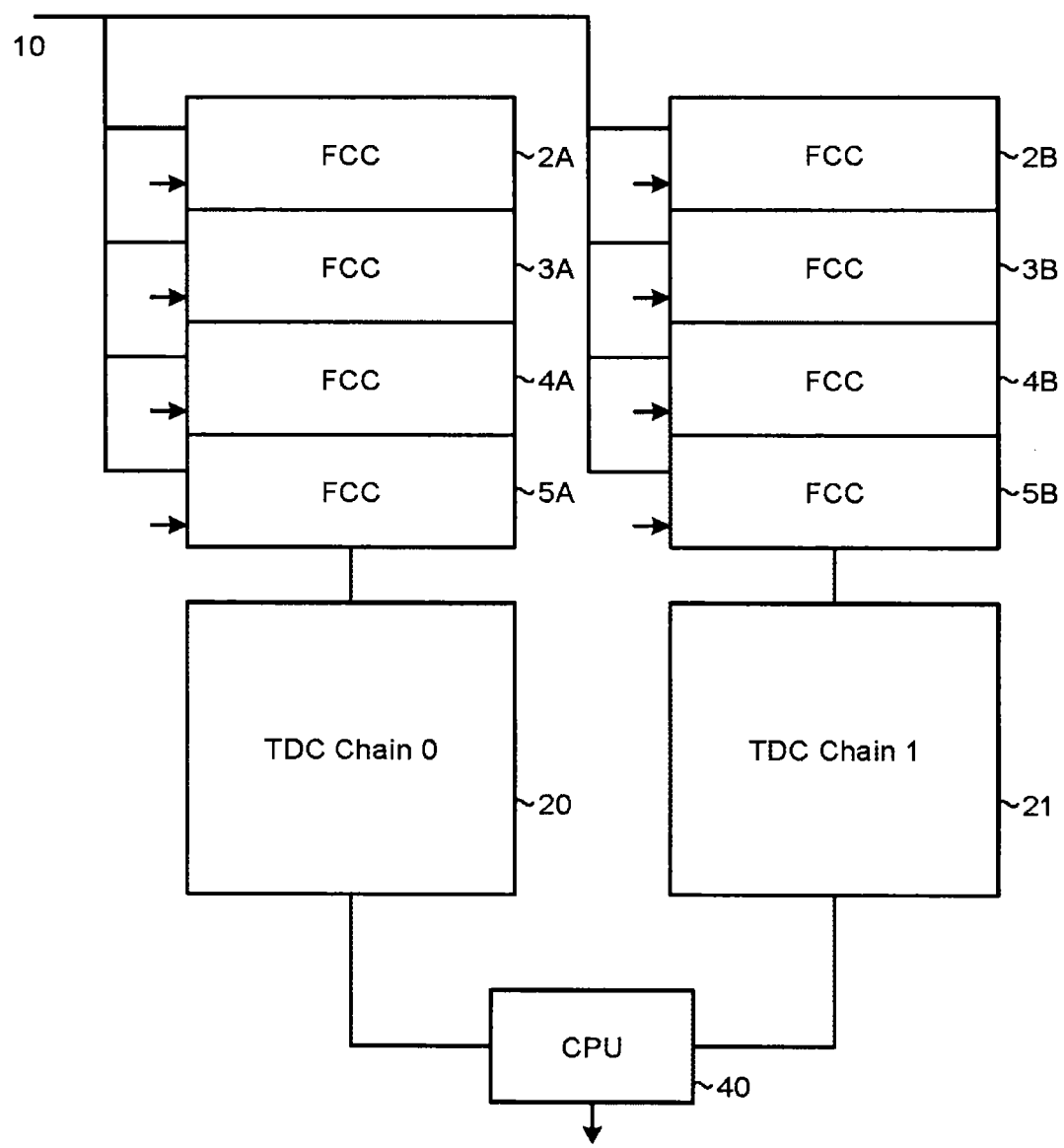
FIG. 3 is another schematic drawing of an apparatus for delaying a signal to a plurality of chain-based TDCs according to one embodiment.

FIG. 3 illustrates an overall view of the system, which includes the TDC chains 0 and 1 20/21 as well as the fast-carry chain (FCC) modules 2A-5A and 2B-5B. As illustrated in this figure, the start signal TDC_start is received at input 10 and based on previously determined settings, particular FCC modules are selected to be included in the path, such that the propagation delay is tuned to the particular characteristics of the respective TDC chain. The outputs of the TDC chain are then output to the CPU 40. The stop signal is the clock signal to the flip-flops in TDC Chain 0 and TDC Chain 1 20/21.

The TDC chains 0 and 1 denoted as 20/21 in FIG. 3 may be implemented on one or more FPGAs with one circuit per trigger zone when the TDC chains are implemented, for example, in a PET system. In such a time-of-flight PET system, the TDC chains typically produce a time stamp with an accuracy of in the range of ps.

Figure 4:
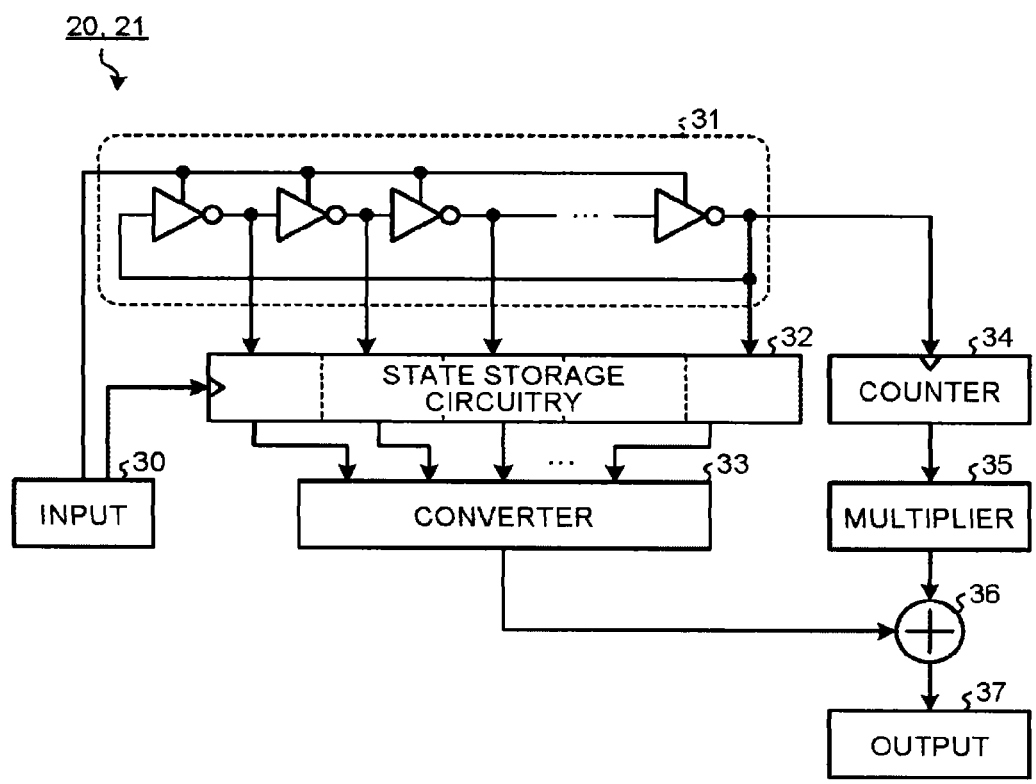
FIG. 4 is a block diagram of a configuration of the TDC chain.

FIG. 4 is a block diagram of a configuration of the TDC chains 0 and 1 20/21. As illustrated in FIG. 4, each of the TDC chains 0 and 1 20/21 includes an input 30, a ring oscillator 31, state storage circuitry 32, a converter 33, a counter 34, a multiplier 35, an adder 36, and an output 37. As in the case of the devices 1A/1B, the TDA chains 0 and 1 20/21 may be implemented with discrete logic gates, such as an ASIC, a FPGA, or other Complex Programmable Logic Device (CPLD).

The input 30 receives the TDC_Start and a stop signal. The TDC_Start received by the input 30 is output to the ring oscillator 31 and then is output to the state storage circuitry 32. The ring oscillator 31 is an oscillator with a configuration in which multiple delay elements (inverters) are connected into a ring. The state storage circuitry 32 is, for example, a D flip-flop and it stores the state of the multiple delay elements (logical values) of the ring oscillator 31. The logical values of the multiple delay elements indicate the phases (times) each from when a signal (TDC_Start) is input to the ring oscillator 31 to when the signal is output. The converter 33 converts the phases represented by the logical values of the multiple delay elements, which are stored in the state storage circuitry 32, into values corresponding to the times. The counter 34 counts according to the output of the delay element of the last stage of the ring oscillator 31. On the basis of the value counted by the counter 34, the multiplier 35 multiplies for the value corresponding to the time of one cycle of the ring oscillator 31. The adder 36 adds up the values of the converter 33 and the multiplier 35. The output 37 outputs the value obtained by the adder 36, i.e., the value (time stamp) indicating the time from the input of TDC_Start until the input of the stop signal.

A commercial gamma ray detector such as in a PET system includes an array of scintillator crystals coupled to a transparent light guide, which distributes scintillation light over an array of photomultiplier tubes (PMTs) arranged over the transparent light guide. Signals from the PMTs in a same area are generally summed in the analog domain, and then timing is measured based on the leading edge of the summed signal, or event.

Figure 5:
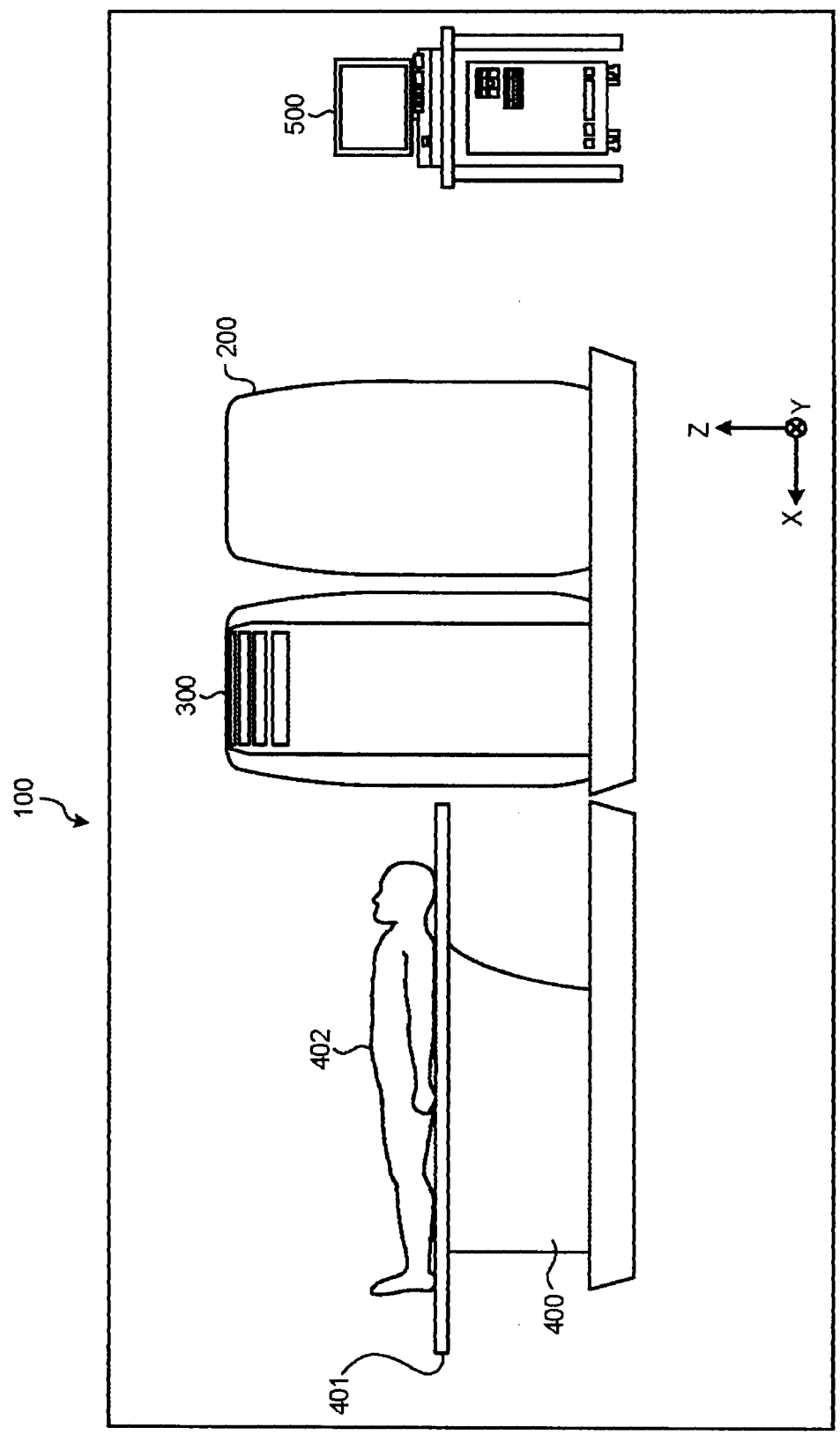
FIG. 5 is an illustration of an exemplary nuclear medicine imaging device according to the embodiment.

FIG. 5 is an illustration of an exemplary nuclear medicine imaging device. As illustrated in FIG. 5, there is a PET-CT apparatus 100 as an exemplary nuclear medical imaging device. In FIG. 5, 200 denotes a PET scanner, 300 denotes an X-ray CT scanner, 400 denotes a bed, 401 denotes a tabletop on which a subject is lying, and 402 denotes the subject. The PET-CT apparatus 100 includes the PET scanner 200, the X-ray CT scanner 300, the bed 400, and a console device 500. The X-direction in FIG. 5 represents a direction of the body axis of the subject 402 lying on the tabletop 401 illustrated in FIG. 5. The Y-direction represents a direction orthogonal to the X-direction on a horizontal plane. The Z-direction represents a vertical direction.

The bed 400 includes the tabletop 401 on which the subject 402 is lying. Furthermore, the bed 400 includes bed control circuitry, which is not illustrated in FIG. 5, for moving the tabletop 401. The bed control circuitry is controlled by the console device 500, and moves the subject 402 lying on the tabletop 401 into an imaging bore of the PET-CT apparatus 100.

The PET scanner 200 includes multiple photon counting gamma-ray detectors (to be described later) that counts light derived from gamma rays for reconstructing a PET image. The multiple gamma-ray detectors are arranged on the ring about the body axis of the subject 402. The gamma detector, from outside of the body of the subject 402 lying on the tabletop 401, detects a pair of gamma rays (pair annihilation gamma rays) emitted from inside of the body of the subject 402, for example.

Specifically, every time the gamma-ray detector counts the gamma rays, the PET scanner 200 collects the detection position indicating a position of the gamma-ray detector that detects the gamma rays, the energy value at the time when the gamma rays are incident on the gamma-ray detector, and the detection time at which the gamma-ray detector detects the gamma rays. The above-described TDC is used to collect the detection time. Accordingly, the PET-CT apparatus 100 reconstructs a PET image where the heavy particle beam path is depicted.

The X-ray CT scanner 300 includes an X-ray tube that emits X-rays for reconstructing an X-ray CT image and an X-ray detector that detects the X-rays emitted by the X-ray tube. In the X-ray CT scanner 300, the X-ray tube irradiates the subject 402 with the X-rays, and the X-ray detector detects the X-rays passing through the subject 402. Specifically, the X-ray tube emits the X-rays, and the X-ray detector detects the X-rays while the X-ray CT scanner 300 is rotating about the body axis of the subject 402. In other words, the X-ray CT scanner 300 irradiates the subject with the X-rays in multi-directions, and detects the attenuated X-rays absorbed in the subject 402 by passing through the subject 402 while being rotating about the body axis of the subject 402. Data generated by performing amplification processing, AD conversion processing, and the like on the X-rays detected by the X-ray detector is also referred to as "X-ray projection data". The X-ray CT scanner 300 collects the X-ray projection data and the detection position at which the X-rays used for generating the X-ray projection data are detected.

Figure 6:
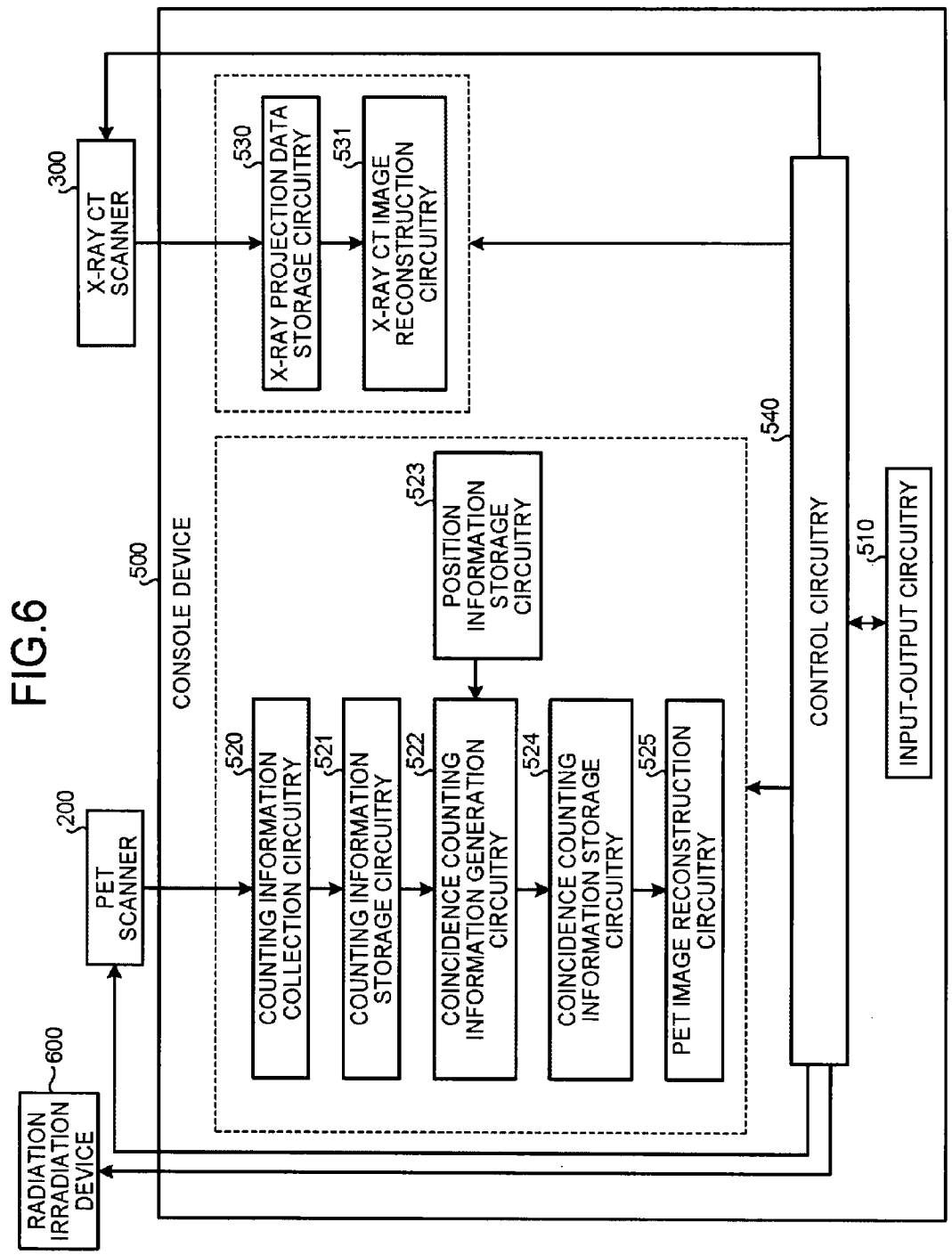
FIG. 6 is a block diagram of an exemplary configuration of a console device according to the embodiment.

FIG. 6 is a block diagram of an exemplary configuration of the console device according to the first embodiment. The console device 500 reconstructs an X-ray CT image based on the information collected by the X-ray CT scanner 300. Furthermore, the console device 500 generates coincidence counting information by using the counting information collected by the PET scanner 200, and reconstructs a PET image based on the coincidence counting information thus generated. In the description below, the processing for reconstructing a PET image and the processing for reconstructing an X-ray CT image by the console device 500 may be performed by using an arbitrary method, and an explanation thereof will be made succinctly.

Figure 9:
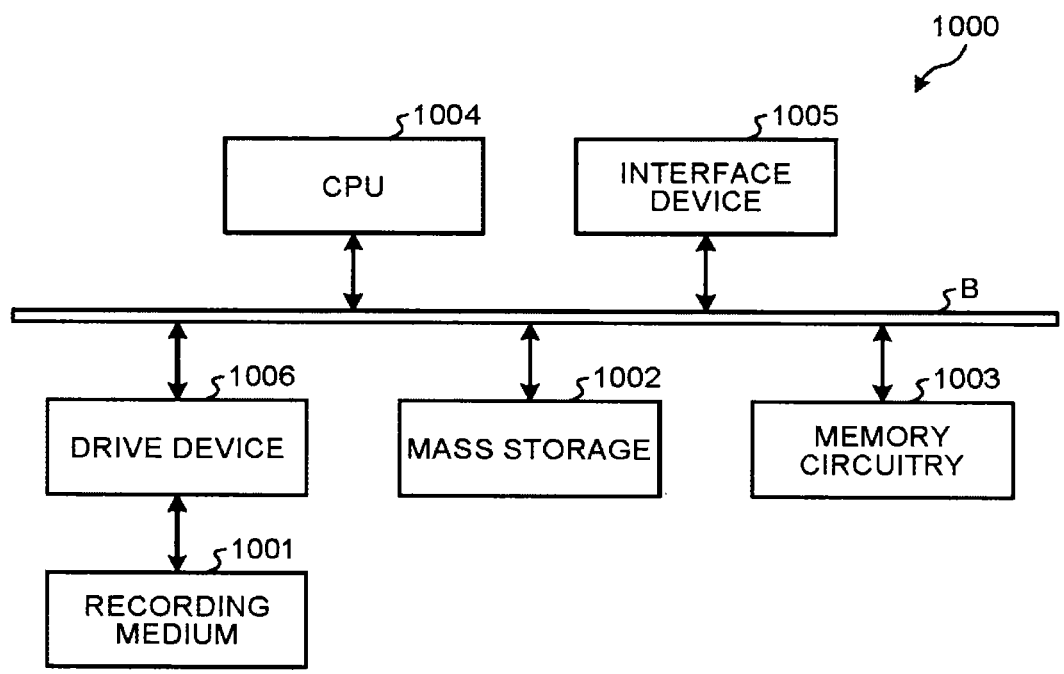
FIG. 9 illustrates a computing device according to one embodiment.

In the example illustrated in FIG. 6, the PET scanner 200, the X-ray CT scanner 300, and the radiation irradiation device 600 are illustrated in addition to the console device 500 as a matter of convenience for explanation. As illustrated in FIG. 9, the console device 500 includes input-output circuitry 510 and control circuitry 540. In addition, the console device 500 includes X-ray projection data storage circuitry 530 and X-ray CT image reconstruction circuitry 531 so as to reconstruct an X-ray CT image. Furthermore, the console device 500 includes counting information collection circuitry 520, counting information storage circuitry 521, coincidence counting information generation circuitry 522, position information storage circuitry 523, coincidence counting information storage circuitry 524, and PET image reconstruction circuitry 525 so as to reconstruct a PET image. In the embodiment, an explanation is made of the case where one console device 500 reconstructs an X-ray CT image and a PET image. However, the embodiment can be applied to the case where reconstruction of an X-ray CT image and reconstruction of a PET image are performed in different console devices.

The input-output circuitry 510 is connected to the control circuitry 540. The input-output circuitry 510 receives various types of instructions from a user who uses the radiation therapy apparatus, and transmits the various types of instructions thus received to the control circuitry 540. Furthermore, the input-output circuitry 510 receives information from the control circuitry 540, and outputs the information thus received to the user. The input-output circuitry 510 is, for example, a keyboard, a mouse, a microphone, a monitor, and, a speaker. Explanations of details of the information and the instructions received by the input-output circuitry 510 and a detail of the information output by the input-output circuitry 510 are omitted herein.

The control circuitry 540 includes an internal memory that stores therein a program specifying various types of processing processes and the like, and controls various types of processing. For example, the control circuitry 540 is an electronic circuit, such as an ASIC, a FPGA, a central processing unit (CPU), and a micro processing unit (MPU). The control circuitry 540 controls the whole processing of the radiation therapy apparatus. Specifically, the control circuitry 540 controls the PET scanner 200 and the X-ray CT scanner 300, thereby controlling radiography performed by the PET-CT apparatus 100. Furthermore, the control circuitry 540 controls the radiation irradiation device 600 so as to emit the heavy particle beam in multi-directions consecutively or intermittently in accordance with the treatment plan.

The control circuitry 540 controls the reconstruction processing of a PET image and the reconstruction processing of an X-ray CT image in the console device 500. Furthermore, the control circuitry 540 displays a PET image, an X-ray CT image, a superimposed image of a PET image and an X-ray CT image, or the like on the monitor of the input-output circuitry 510.

The X-ray projection data storage circuitry 530 stores therein X-ray projection data transmitted from the X-ray CT scanner 300. The X-ray CT image reconstruction circuitry 531 performs back projection processing on the X-ray projection data stored in the X-ray projection data storage circuitry 530 by the filtered back projection (FBP) method, for example, thereby reconstructing an X-ray CT image.

The counting information collection circuitry 520 collects counting information from counting results output by the detectors 210, and stores the counting information in the counting information storage circuitry 521. In other words, the counting information collection circuitry 520 uses the TDC, which is described above, to collect the detection time in the counting information. The counting information collection circuitry 520 sequentially receives the counting information collected by the PET scanner 200, and stores the counting information thus received in the counting information storage circuitry 521. The counting information collection circuitry 520 may be included in the PET scanner 200.

The counting information storage circuitry 521 stores therein the counting information stored by the counting information collection circuitry 520. For example, the counting information storage circuitry 521 is a semiconductor memory device, such as a RAM and a flash memory, or a storage device, such as a hard disk and an optical disk. The counting information storage circuitry 521 stores therein the "scintillator number", the "energy value", and the "detection time" in a manner corresponding to the "module ID". The "module ID" is the information uniquely identifying the detector provided in plurality.

Specifically, the coincidence counting information generation circuitry 522 generates a combination of two pieces of counting information whose difference in detection time is within a time window among the counting information stored in the counting information storage circuitry 521 as coincidence counting information obtained by counting pair annihilation gamma rays nearly coincidentally.

Specifically, the coincidence counting information generation circuitry 522 generates the coincidence counting information based on conditions of coincidence counting information generation specified by an operator. The conditions of coincidence counting information generation include the time window, for example. The time window indicates an upper limit of difference between two detection times in the case where a pair of gamma rays are both counted.

For a pair of gamma rays emitted coincidentally from a positron-emitting radionuclide, the detection times of the gamma rays each included in the pair of gamma rays are the same, or difference between the two detection times is small even if the detection times are not the same. As a result, the coincidence counting information generation circuitry 522 uses the time window to prevent false coincidence counting information from being generated.

For example, an explanation will be made of the case where the coincidence counting information generation circuitry 522 generates the coincidence counting information by using a time window of "10 nanoseconds". In this case, the coincidence counting information generation circuitry 522 refers to the "detection time (T)" of each "module ID", and searches for a combination of the counting information whose difference between two detection times is within a "time window of 10 nanoseconds" among the modules.

Searching for a combination in which the detection time is within the time window is also referred to as "coincidence finding". A list of the coincidence counting information generated by the coincidence counting information generation circuitry 522 is also referred to as a "coincidence list".

An energy window may be set as the conditions of coincidence counting information generation. The energy value of a pair of gamma rays emitted by annihilation of a positron is already specified in advance. For example, 18F, 15O, and 11C each emit gamma rays of "511 keV". Therefore, any gamma rays emitted coincidentally from a positron-emitting radionuclide have an energy value within a predetermined range. As a result, the coincidence counting information generation circuitry 522 uses the energy window to exclude counting information not of the pair of gamma rays emitted from the positron-emitting radionuclide, and generates the coincidence counting information. Thus, the coincidence counting information generation circuitry 522 can prevent false coincidence counting information from being generated. As described above, setting the conditions of coincidence counting information generation makes it possible to perform random correction for excluding accidental coincidence counting, scatter correction for preventing counting information of scattered gamma rays from being generated as the coincidence counting information, sensitivity correction for correcting difference in sensitivity among the detectors, etc.

The coincidence counting information generation circuitry 522 then stores the coincidence counting information thus generated in the coincidence counting information storage circuitry 524. For example, the coincidence counting information storage circuitry 524 is a semiconductor memory device, such as a RAM and a flash memory, or a storage device, such as a hard disk and an optical disk.

The PET image reconstruction circuitry 525 reads the coincidence counting information generated by the coincidence counting information generation circuitry 522 from the coincidence counting information storage circuitry 524, and uses the coincidence counting information thus read to reconstruct a PET image. Specifically, the PET image reconstruction circuitry 525 considers the coincidence counting information to be projection data of the gamma rays, and reconstructs the PET image from the projection data of the gamma rays by using a successive approximation method. The successive approximation methods include a maximum likelihood expectation maximization (MLEM) method, and an ordered subset MLEM (OSEM) method in which the convergence time is significantly shortened by improving the algorithm of the MLEM method. The PET image reconstructed by the PET image reconstruction circuitry 525 is displayed on the monitor of the input-output circuitry 510 under the control of the control circuitry 540.

For each PMT, there may be an independent electronics path that is used to measure the amplitude of the signal on each PMT. This path may include a filter and an analog-to-digital converter (ADC). The filter, typically a bandpass filter, is used to optimize the signal-to-noise ratio of the measurement and performs an anti-aliasing function prior to conversion to a digital signal by the ADC. The ADC can be a free-running type, running at 100 MHz, for example, in which case a central processing unit, or CPU 40, performs a digital integration, or the ADC can be a peak-sensing type. The ADC and TDC outputs are provided to a CPU 40 for processing. The processing includes of estimating an energy and position from the ADC outputs, and an arrival time from the TDC output for each event, and may include the application of several correction steps, based on prior calibrations, to improve the accuracy of the energy, position, and time estimates.

As one of ordinary skill in the art would recognize, the CPU 40 can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or COLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the CPU 40 may be implemented as a set of computer-readable instructions stored in any of the above-described electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xenon (trademark) processor from Intel of America or an Opteron processor from AMD (trademark) of America and an operating system, such as Microsoft VISTA, UNIX (trademark), Solaris (trademark), LINUX (trademark), Apple, MAC-OSX (trademark) and other operating systems known to those skilled in the art.

Once processed by the CPU 40, the processed signals are stored in electronic storage, and/or displayed on display. As one of ordinary skill in the art would recognize, electronic storage may be a hard disk drive, CD-ROM drive, DVD drive, FLASH drive, RAM, ROM or any other electronic storage known in the art. Display may be implemented as an LCD display, CRT display, plasma display, OLED, LED or any other display known in the art. As such, the descriptions of the electronic storage and the display provided herein are merely exemplary and in no way limit the scope of the present advancements.

The CPU 40 can also, in an alternative embodiment, perform calculations to determine the best propagation delay for each TDC chain. Thus, the CPU can use feedback control or other similar mechanisms to determine how much propagation delay to add to the chain to increase the timing accuracy of the implemented TDC on every chip. In such an embodiment, the activation signals received at the Enable0_n and Enable1_n inputs are output by the CPU 40 and input into the respective fast-carry chain modules.

Figure 7:
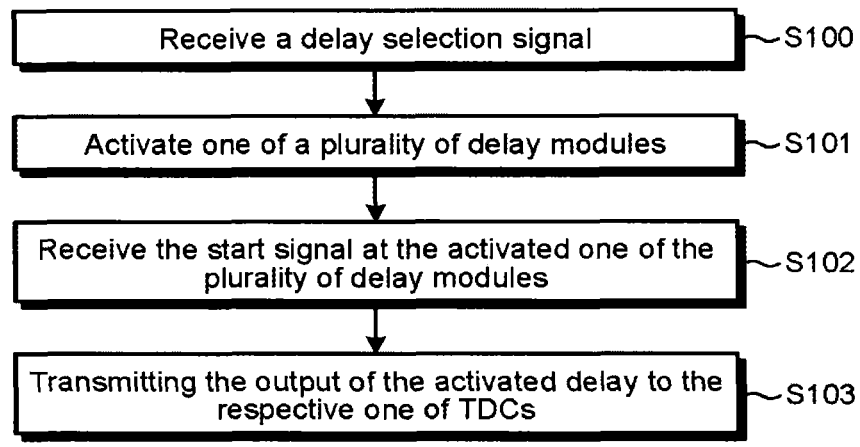
FIG. 7 is a flow diagram illustrating the process of delaying a signal to a plurality of chain-based TDCs according to one embodiment.

FIG. 7 is a flow diagram illustrating the process of delaying a signal to a plurality of chain-based TDCs according to one embodiment and illustrates a method for delaying a signal to a plurality of chain-based time to digital circuits (TDCs). For example, the process of the flow diagram is performed under the control of the CPU 40 (see FIG. 3).

In step S100, a delay selection signal is received which indicates a determination of an amount of time to delay a start signal.

In step S101, each one of a plurality of propagation path devices activates at least one of a plurality of delay modules based on the delay selection signal. Each of the plurality of delay modules provides delay to the start signal, which is routed to a respective TDC via at least one of the plurality of delay modules.

In step S102, the start signal is received at the activated one of the plurality of delay modules. In particular, the TDC start signal is routed to bypass upstream modules, which are not activated, and to enter into the first activated one of the plurality of delay modules.

In step S103, the output of the activated delay is then transmitted to the respective one of TDCs 20 and FIG. 5 illustrates a method of calibrating a system including a plurality of chain-based time-to-digital circuits (TDCs).

Figure 8:
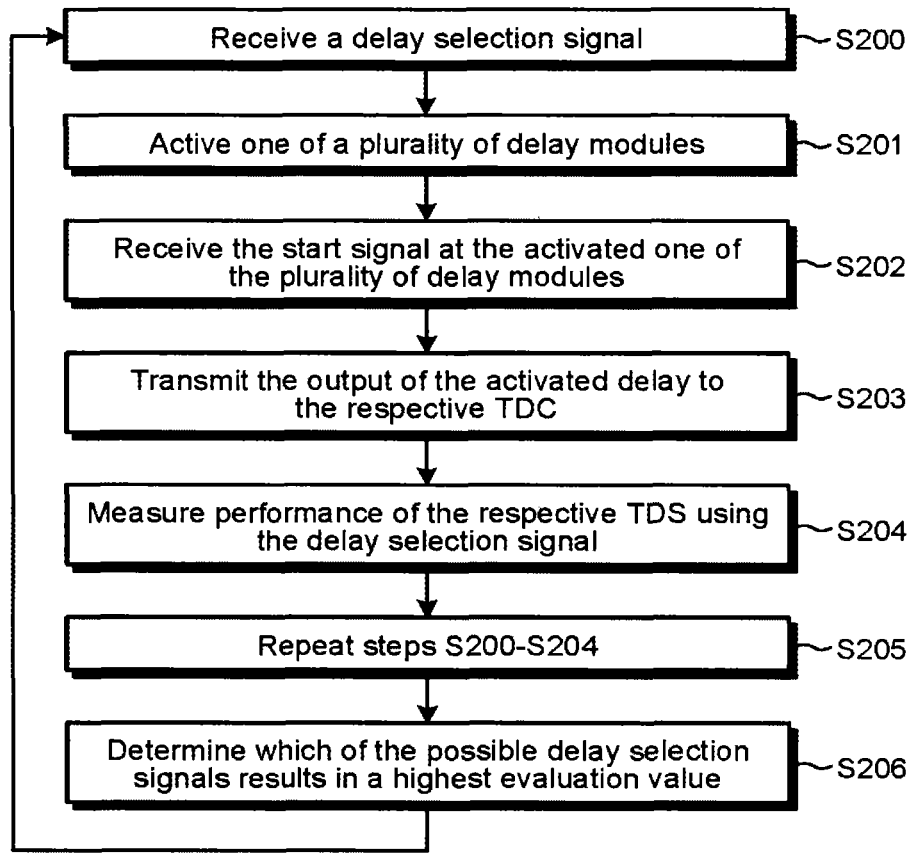
FIG. 8 is a flow diagram illustrating the process for determining the optimal delay according to one embodiment.

FIG. 8 is a flow diagram illustrating the process for determining the optimal delay according to one embodiment and illustrates a method for calibrating the system that includes a plurality of chain-based time to digital circuits (TDCs). For example, the process of the flow diagram is performed under the control of the CPU 40 (see FIG. 3).

In step S200, a delay selection signal is received at each delay device indicating an amount of time to delay the TDC start signal. The delay selection signal indicates the amount of time to delay the signal by way of indicating which one of the particular delay modules is to be selected.

In step S201, each one of a plurality of propagation path devices activates at least one of the plurality of delay modules based on the delay selection signal. Each of the plurality of delay modules provides delay to the TDC start signal.

In step S202, the start signal is received at the activated one of the plurality of delay modules.

In step S203, the output of the activated delay is transmitted to the respective TDC.

In step S204, the performance of the respective TDC is measured using the delay selection signal to obtain an evaluation value for the delay selection signal. The delay selection signal or group of selection signals are compared with an output result of the TDC system in order to determine an evaluation value which for the delay selection signal(s). The evaluation values are recorded in association with the delay selection signal(s).

In step S205, steps S201-S204 are repeated for each possible delay selection signal or combination to obtain a plurality of evaluation values with one evaluation value for each possible delay selection signal or group of selection signals. Each of these evaluation values is recorded in association with the respective signal or signals.

In step S206, a determination is made regarding which of the possible delay selection signal(s) results in the highest evaluation value. As is described above, the various delay configurations can be evaluated using a technique in which pairs of start-stop signals of known timing (for example from a function generator) are injected into the system. For each configuration of enable0_n and enable1_n pairs as described above, a histogram of the times between the start and stop, as measured by the TDC in a given configuration, is generated. This generation may be performed using a microprocessor implemented histogram generation program. A distribution of timing values is derived from the histogram. The distribution is analyzed and the quality of the configuration is based on a metric calculated in the distribution. Examples of the metric include but are not limited to the standard deviation or the Full Width Half Max (FWHM). The selection signal or signals determined to provide the optimal delay can then be used to provide the optimal delay for the TDC process.

Certain portions of the processing, such as the optimization and the generation of delay selection signal, can be implemented or aided by using some form of computer having at least one microprocessor or by using a processor. As one of ordinary skill in the art would recognize, the computer processor can be implemented as discrete logic gates, as an Application Specific Integrated Circuit (ASIC), a Field Programmable Gate Array (FPGA) or other Complex Programmable Logic Device (CPLD). An FPGA or CPLD implementation may be coded in VHDL, Verilog or any other hardware description language and the code may be stored in an electronic memory directly within the FPGA or CPLD, or as a separate electronic memory. Further, the electronic memory may be non-volatile, such as ROM, EPROM, EEPROM or FLASH memory. The electronic memory may also be volatile, such as static or dynamic RAM, and a processor, such as a microcontroller or microprocessor, may be provided to manage the electronic memory as well as the interaction between the FPGA or CPLD and the electronic memory.

Alternatively, the computer processor may execute a computer program including a set of computer-readable instructions that perform the functions described herein, the program being stored in any of the above-described non-transitory electronic memories and/or a hard disk drive, CD, DVD, FLASH drive or any other known storage media. Further, the computer-readable instructions may be provided as a utility application, background daemon, or component of an operating system, or combination thereof, executing in conjunction with a processor, such as a Xenon processor from Intel of America or an Opteron processor from AND of America and an operating system, such as Microsoft VISTA, UNIX, Solaris, LINUX, Apple, MAC-OSX and other operating systems known to those skilled in the art.

In addition, certain features of the embodiments can be implemented using a computer based system (FIG. 6). The computer 1000 includes a bus B or other communication mechanism for communicating information, and a processor/CPU 1004 coupled with the bus B for processing the information. The computer 1000 also includes a main memory/memory circuitry 1003, such as a random access memory (RAM) or other dynamic storage device (e.g., dynamic RAM (DRAM), static RAM (SRAM), and synchronous DRAM (SDRAM)), coupled to the bus B for storing information and instructions to be executed by processor/CPU 1004. In addition, the memory circuitry 1003 may be used for storing temporary variables or other intermediate information during the execution of instructions by the CPU 1004. The computer 1000 may also further include a read only memory (ROM) or other static storage device (e.g., programmable ROM (PROM), erasable PROM (EPROM), and electrically erasable PROM (EEPROM)) coupled to the bus B for storing static information and instructions for the CPU 1004.

The computer 1000 may also include a disk controller coupled to the bus B to control one or more storage devices for storing information and instructions, such as mass storage 1002, and drive device 1006 (e.g., floppy disk drive, read-only compact disc drive, read/write compact disc drive, compact disc jukebox, tape drive, and removable magneto-optical drive). The storage devices may be added to the computer 1000 using an appropriate device interface (e.g., small computer system interface (SCSI), integrated device electronics (IDE), enhanced-IDE (E-IDE), direct memory access (DMA), or ultra-DMA).

The computer 1000 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer 1000 may also include a display controller coupled to the bus B to control a display, such as a cathode ray tube (CRT), for displaying information to a computer user. The computer system includes input devices, such as a keyboard and a pointing device, for interacting with a computer user and providing information to the processor. The pointing device, for example, may be a mouse, a trackball, or a pointing stick for communicating direction information and command selections to the processor and for controlling cursor movement on the display. In addition, a printer may provide printed listings of data stored and/or generated by the computer system.

The computer 1000 performs at least a portion of the processing steps of the invention in response to the CPU 1004 executing one or more sequences of one or more instructions contained in a memory, such as the memory circuitry 1003. Such instructions may be read into the memory circuitry from another computer readable medium, such as the mass storage 1002 or a removable media 1001. One or more processors in a multi-processing arrangement may also be employed to execute the sequences of instructions contained in memory circuitry 1003. In alternative embodiments, hard-wired circuitry may be used in place of or in combination with software instructions. Thus, embodiments are not limited to any specific combination of hardware circuitry and software.

As stated above, the computer 1000 includes at least one computer readable medium 1001 or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other medium from which a computer can read.

Stored on any one or on a combination of computer readable media, the present invention includes software for controlling the main processing unit 1004, for driving a device or devices for implementing the invention, and for enabling the main processing unit 1004 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code elements on the medium of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the CPU 1004 for execution. A computer readable medium may take many forms, including but not limited to, non-volatile media, and volatile media. Non-volatile media includes, for example, optical, magnetic disks, and magneto-optical disks, such as the mass storage 1002 or the removable media 1001. Volatile media includes dynamic memory, such as the memory circuitry 1003.

Various forms of computer readable media may be involved in carrying out one or more sequences of one or more instructions to the CPU 1004 for execution. For example, the instructions may initially be carried on a magnetic disk of a remote computer. An input coupled to the bus B can receive the data and place the data on the bus B. The bus B carries the data to the memory circuitry 1003, from which the CPU 1004 retrieves and executes the instructions. The instructions received by the memory circuitry 1003 may optionally be stored on mass storage 1002 either before or after execution by the CPU 1004.

The computer 1000 also includes a communication interface 1005 coupled to the bus B. The communication interface 1004 provides a two-way data communication coupling to a network that is connected to, for example, a local area network (LAN), or to another communications network such as the Internet. For example, the communication interface 1005 may be a network interface card to attach to any packet switched LAN. As another example, the communication interface 1005 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1005 sends and receives electrical, electromagnetic or optical signals that carry digital data streams representing various types of information.

The network typically provides data communication through one or more networks to other data devices. For example, the network may provide a connection to another computer through a local network (e.g., a LAN) or through equipment operated by a service provider, which provides communication services through a communications network. The local network and the communications network use, for example, electrical, electromagnetic, or optical signals that carry digital data streams, and the associated physical layer (e.g., CAT 5 cable, coaxial cable, optical fiber, etc). Moreover, the network may provide a connection to a mobile device such as a personal digital assistant (PDA) laptop computer, or cellular telephone.

In the above descriptions, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions may be executed out of order from that shown or discussed, including substantially concurrently or in reverse order, depending upon the functionality involved, as would be understood by those skilled in the art.

A delay apparatus of the embodiment is an apparatus for delaying a signal to a plurality of chain-based time-to-digital circuits (TDCs) that includes a plurality of propagation path devices each connected to a respective one of the plurality of TDCs. Each propagation path device is configured to delay a common start signal sent to each propagation path device by a selectable amount based on a delay selection signal received by the propagation path device, and to transmit the delayed start signal to the respective one of the TDCs.

While certain embodiments have been described, these embodiments have been presented by way of example only, and are not intended to limit the scope of the inventions. Indeed, the novel methods, apparatuses and systems described herein may be embodied in a variety of other forms; furthermore, various omissions, substitutions and changes in the form of the methods, apparatuses and systems described herein may be made without departing from the spirit of the inventions. The accompanying claims and their equivalents are intended to cover such forms or modifications as would fall within the scope and spirit of the inventions.

What is claimed is:

1. A method for controlling a nuclear medicine imaging device that includes a plurality of propagation path devices each connected to a respective one of a plurality of time-to-digital circuits (TDCs), the method comprising:
   receiving a delay selection signal indicating a determination of an amount of time to delay a start signal;
   activating, at each one of the plurality of propagation path devices, a selected delay module of a plurality of delay modules based on the received delay selection signal, each of the plurality of delay modules providing delay to the start signal, which is received by a respective TDC via at least one of the plurality of delay modules;
   receiving the start signal at the activated delay module;
   delaying the start signal by way of propagation through the activated delay module; and
   transmitting the delayed start signal to the respective TDC.

2. The method according to claim 1, wherein the activating further comprises:
   activating one of the plurality of delay modules to receive the start signal based on the delay selection signal.

3. The method according to claim 1, wherein the delaying further comprises:
   delaying the start signal by passing the start signal through a logic array block look-up table (LUT).

4. The method according to claim 1, wherein the receiving further comprises:
   receiving the start signal by bypassing each delay module upstream from the activated delay module.

5. The method according to claim 1, wherein the transmitting further comprises:
   transmitting the start signal to the TDC though each delay module downstream from the activated delay module.

6. A method of calibrating a system including a plurality of chain-based time-to-digital circuits (TDCs), comprising:
   receiving a delay selection signal indicating an amount of time to delay a start signal;
   activating, at each one of a plurality of propagation path devices, a selected delay module of a plurality of delay modules based on the received delay selection signal, each of the plurality of delay modules providing delay to the start signal, which is received by a respective TDC via at least one of the plurality of delay modules;
   receiving the start signal at the activated delay module;
   delaying the start signal by way of propagation through the activated delay module;
   transmitting the delayed start signal to the respective TDC;

measuring performance of the respective TDC using the delay selection signal to obtain an evaluation value for the delay selection signal;

repeating the receiving, activating, receiving, delaying, transmitting, and measuring step for each possible delay selection signal to obtain a corresponding evaluation value for each possible delay selection signal; and determining which of the possible delay selection signals results in a highest evaluation value.

* * * * *